United States Patent
Arberet et al.

(10) Patent No.: US 12,379,440 B2
(45) Date of Patent: Aug. 5, 2025

(54) MULTICHANNEL DEEP LEARNING RECONSTRUCTION OF MULTIPLE REPETITIONS

(71) Applicant: Siemens Healthineers AG, Forchheim (DE)

(72) Inventors: Simon Arberet, Princeton, NJ (US); Marcel Dominik Nickel, Herzogenaurach (DE); Thomas Benkert, Neunkirchen am Brand (DE); Mahmoud Mostapha, Princeton, NJ (US); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 451 days.

(21) Appl. No.: 17/815,230

(22) Filed: Jul. 27, 2022

(65) Prior Publication Data

US 2024/0036138 A1 Feb. 1, 2024

(51) Int. Cl.
*G01R 33/563* (2006.01)
*G01R 33/56* (2006.01)
*G06F 18/214* (2023.01)

(52) U.S. Cl.
CPC ... *G01R 33/5608* (2013.01); *G01R 33/56341* (2013.01); *G06F 18/214* (2023.01)

(58) Field of Classification Search
CPC .......... G01R 33/5608; G01R 33/56341; G06F 18/214; G06T 2207/10088; G06T 2211/424; G06T 7/0012; G06T 2207/20081; G06T 2211/441; G06T 2211/412; G16H 30/40; G06V 10/774; G06N 20/00
See application file for complete search history.

(56) References Cited

U.S. PATENT DOCUMENTS

| | | | |
|---|---|---|---|
| 10,751,548 B2 * | 8/2020 | Han | G16H 30/40 |
| 2021/0158583 A1 * | 5/2021 | Huang | G06T 11/005 |
| 2022/0011391 A1 * | 1/2022 | Kartäusch | G01R 33/3415 |
| 2022/0343565 A1 * | 10/2022 | Takeshima | G16H 50/20 |

OTHER PUBLICATIONS

Javier Montalt—Tordera Machine Learning in Magnetic Resonance Imaging: Image Reconstruction (Year: 2020).*
Johnson, Patricia M., et al. "Deep learning reconstruction enables highly accelerated biparametric mr imaging of the prostate." Journal of Magnetic Resonance Imaging 56.1 (2022): 184-195.

* cited by examiner

*Primary Examiner* — Andrew M Moyer
*Assistant Examiner* — Ahmed A Nasher

(57) ABSTRACT

Systems and methods for reconstruction for a medical imaging system. An adapter is used to adapt scan data so that different quantities of repetitions or directions may be used to train and implement a single multichannel backbone network.

17 Claims, 7 Drawing Sheets

MULTICHANNEL DEEP LEARNING RECONSTRUCTION OF MULTIPLE REPETITIONS

FIELD

This disclosure relates to medical image reconstruction, such as reconstruction in magnetic resonance (MR) imaging.

BACKGROUND

Some types of medical imaging perform reconstruction for imaging, such as MR, computed tomography (CT), positron emission tomography (PET), or single photon emission computed tomography (SPECT). Certain protocols often acquire images with multiple repetitions/averages or directions, for example, in the case of diffusion weighted imaging (DWI). These repetitions and diffusion directions are usually reconstructed separately. However, the repetitions/directions include common features that can be exploited during the reconstruction to increase the quality of the reconstruction.

The repetitions/directions also contain redundant information. Therefore, rather than reconstructing each repetition independently from each other, it may be more advantageous to leverage the common information shared between the different repetitions of the same scan. One approach to exploit this redundant information in the context of a deep-learning reconstruction is to add the repetitions in the channel dimension. For example, a network may be trained to accommodate four repetitions in the channel dimension in order to improve results of the DL-based reconstruction algorithm. However, the number of directions and repetitions for a respective imaging scan is not a fixed setting, but can be freely chosen by the operator, depending on body region, available signal to noise ratio etc. Hence, a typical dataset of DWI images includes many different configurations of number of repetitions and number of directions and thus a single network may not suffice.

To overcome this problem and to be able to exploit information across repetitions/directions separate neural networks may be configured for each configuration of (number of directions×number of repetitions). However, this is both inefficient and also may provide substandard results as each of the networks may be trained on a much smaller dataset.

SUMMARY

By way of introduction, the preferred embodiments described below include methods, systems, instructions, and computer readable media for reconstruction in medical imaging. Embodiments provide a mechanism to be able to use a single multichannel network for all the available data, whatever the configuration of each data in term of number of directions or number of repetitions.

In a first aspect, a system for using a multichannel network for image reconstruction is provided. The system includes a medical scanner, a multichannel network, an adaptor, and a display. The medical scanner is configured to scan a region of a patient, the scan providing scan data including multiple respective repetitions or directions. The multichannel network comprises a fixed number of input channels, the multichannel network configured to reconstruct a representation of the scan data. The adapter is configured to adapt the multiple respective repetitions or directions such that each of the multiple respective repetitions or directions are used as inputs to the multichannel network. The display is configured to display the representation of the scan data.

Scanning may include magnetic resonance scanning pursuant to a protocol for DWI.

In an embodiment, the adapter is configured to duplicate the multichannel network such that each of the multiple respective repetitions or directions is used at least once as an input to the multichannel network or the duplicated multichannel network. The adapter may be configured to assign each of the respective repetitions or directions to respective input channels of the fixed number of input channels of the multichannel backbone network such that each of the fixed number of input channels inputs one of the respective repetitions or directions. The adapter may be configured to compress or decompress, using an encoder decoder network, the multiple respective repetitions or directions such that each of the fixed number of input channels includes an input from the scan data.

In an embodiment, an unrolled network with data-consistency and regularization blocks is used for reconstruction, wherein the multichannel network comprises the regularization blocks of the unrolled network.

The multichannel network is trained using a dataset with scan data with different numbers of repetitions or directions. The multichannel network includes at least four input channels.

In a second aspect, a method of reconstruction for a medical imaging system is provided. The method includes scanning a patient by the medical imaging system, the scanning acquiring scan data comprising multiple repetitions; adapting at least one of the multiple repetitions or a multichannel network such that each input channel of a fixed number of input channels for the multichannel backbone network correspond to at least one of the multiple repetitions; reconstructing, by the multichannel network, an image for the scan data; and displaying the image.

Adapting comprises duplicating the multichannel network such that each of the multiple respective repetitions is used at least once as an input to the multichannel network or the duplicated multichannel network, assigning each of the multiple respective repetitions to respective input channels of the fixed number of input channels of the multichannel network such that each of the fixed number of input channels inputs one of the respective repetitions, or compressing or decompressing, using an encoder decoder network, the multiple respective repetitions.

In an embodiment, an unrolled network with data-consistency and regularization blocks is used for reconstruction, wherein the multichannel network comprises the regularization blocks of the unrolled network. Scanning may comprise magnetic resonance scanning pursuant to a protocol for DWI.

The multichannel network may be trained using a dataset with scan data with different numbers of repetitions. The multichannel network includes at least four input channels. The multiple repetitions comprise different directions.

In a third aspect, a method for training a multichannel network, the method comprising: acquiring a training set of scan data comprising multiple different numbers of repetitions; adapting each of the training data so that the different numbers of repetitions match a fixed number of input channels of a multichannel network; machine training the multichannel network for MR reconstruction using the training data; and storing the multichannel network.

The multichannel network includes at least four input channels.

Adapting comprises at least one of: duplicating the multichannel network such that each of the multiple respective repetitions is used at least once as an input to the multichannel network or the duplicated multichannel network; assigning each of the multiple respective repetitions to respective input channels of the fixed number of input channels of the multichannel network such that each of the fixed number of input channels inputs one of the respective repetitions; or compressing or decompressing, using an encoder decoder network, the multiple respective repetitions.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

Embodiments described herein provide systems and methods that exploit a coupling between the different repetition reconstructions with an architecture that is able to use all the data from the dataset for the training, as opposed to an approach where a different network architecture is used for each configuration of number of repetitions, i.e. one single channel network for the one repetition case, another two-channel network for the two repetitions case, another three-channel network for the three repetitions cases, etc.

In certain medical imaging protocols, repetitions are used to collect, at least in part, redundant information. These repetitions, averages, or contrasts are referred herein to as repetitions. Rather than reconstructing each repetition independently from each other, it may be more advantageous to leverage the common or redundant information shared between the different repetitions of the same scan. In particular medical imaging protocols, for example DWI, additional data is collected, for example in the form of gradient directions or directions (herein directions may be encompassed or referred to as repetitions for simplicity). In diffusion weighted imaging (DWI), the intensity of each image element (voxel) reflects the best estimate of the rate of water diffusion at that location. Traditionally, in diffusion-weighted imaging (DWI), three gradient-directions are applied. More extended scans may use six or more gradient directions up to 20 or 40 or more directions. The repetitions and directions include redundant data.

One approach to exploit this redundant information in the context of a deep-learning reconstruction is to add the repetitions/directions in the channel dimension. Extra input channels are provided for inputting the scan data from the different repetitions/directions into the machine learning model (e.g., network) at the same time. However, this implicitly treats the repetitions/directions in an ordered way. The different repetitions/directions of the same scan can be considered independent from each other in the sense that the order in which they are acquired doesn't matter. Adding the repetitions/directions in the channel dimension misses the property of invariance by permutation of these repetitions/directions and thus misses the opportunity to decrease the dimensionality and the complexity of the reconstruction problem.

Embodiments provide mechanisms that provide a single backbone multichannel network that can be trained using the entirety of a large dataset and thus may provide more accurate results. The size of the dataset the network is trained with is a major key factor for the performance and generalization of the network. Embodiments don't discard any data thanks to the proposed mechanisms that adapts the multichannel network to the number of inputs and outputs available.

Figure 1:
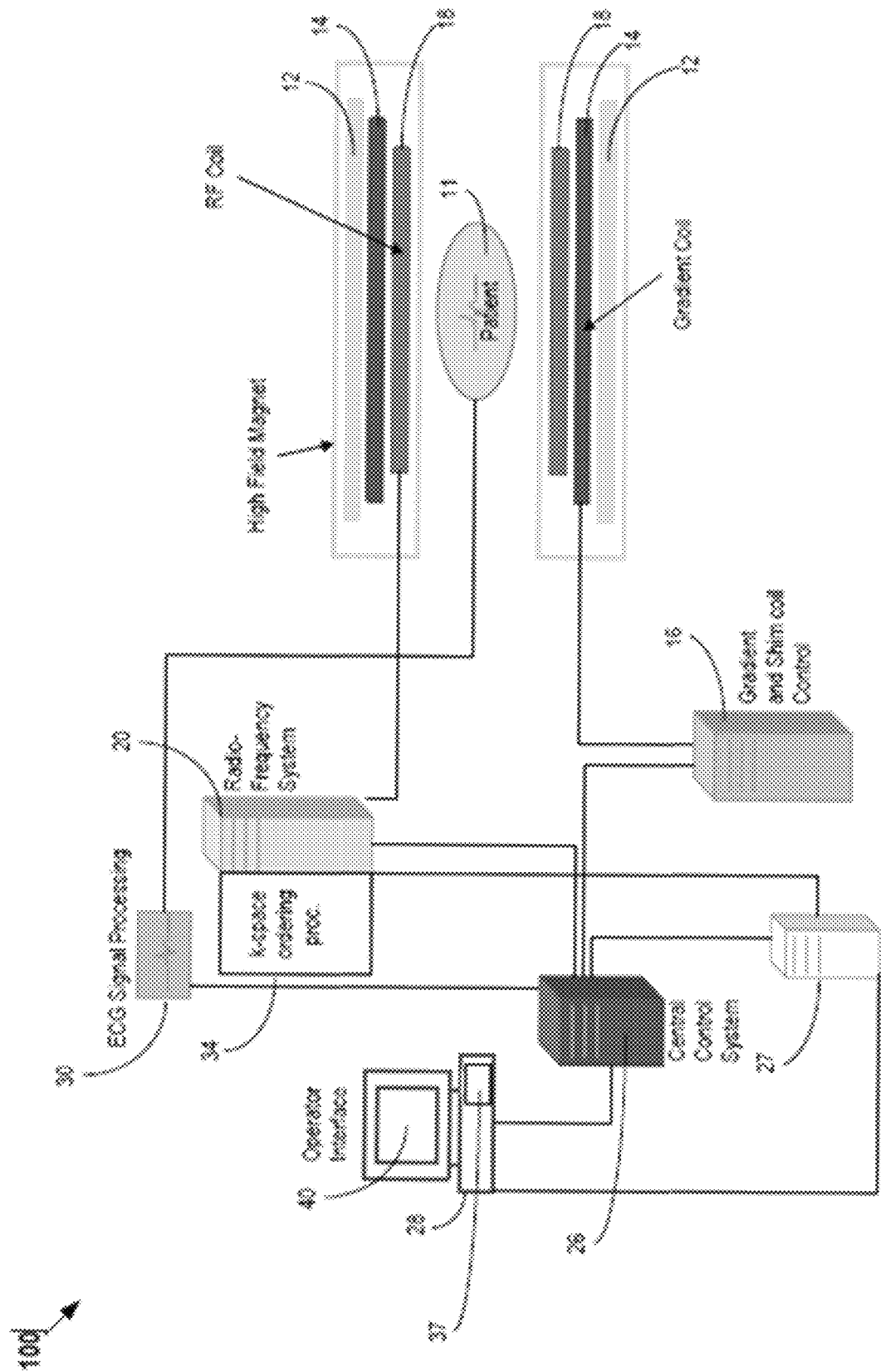
FIG. 1 depicts an example system for reconstruction of a medical image according to an embodiment.

FIG. 1 depicts an embodiment of a system for reconstruction in medical imaging. The system is described below in general, with a following method providing other details. The system implements the method of FIG. 6 or 7, the adapter of FIG. 2, or other instructions. The example used herein is in a MR context (i.e., a MR scanner), but other types of scanners may be used (e.g., reconstruction for CT, PET, SPECT, or other medical imaging). The system is implemented by an MR scanner or system, a computer based on data obtained by MR scanning, a server, or another processor. MR scanning system 100 is only exemplary, and a variety of MR scanning systems can be used to collect the MR data. The MR scanner 100 is configured to scan a patient. The scan provides scan data in a scan domain. The system 100 scans a patient to provide k-space measurements (measurements in the frequency domain). As described herein, the imaging protocol implemented by the scanner includes acquiring multiple repetitions or directions.

In the system 100, magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field pulse sequences.

RF (radio frequency) module 20 provides RF pulse signals to RF coil 18, which in response produces magnetic field pulses that rotate the spins of the protons in the imaged body of the patient 11 by ninety degrees, by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The RF coil 18 may be a whole-body coil or may be formed from one or more local coils, at least on receive. The MR signals are detected and processed by a detector within RF module 20 and k-space component processor unit 34 to provide an MR dataset to an image data processor for processing into an image (i.e., for reconstruction in the object domain from the k-space data in the scan domain). In some embodiments, the image processor is in or is the central control unit 26. In other embodiments, such as the one depicted in FIG. 1, the image processor is in a separate unit 27. ECG synchronization signal generator 30 provides ECG signals used for pulse sequence and imaging synchronization. A two- or three-dimensional k-space storage array of individual data elements in k-space component processor unit 34 stores corresponding individual frequency components forming an MR dataset. The k-space array of individual data elements has a designated center, and individual data elements individually have a radius to the designated center.

A magnetic field generator (comprising coils 12, 14, and 18) generates a magnetic field for use in acquiring multiple individual frequency components corresponding to individual data elements in the storage array. A storage processor in the k-space component processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

The central control unit 26 uses information stored in an internal database to process the detected MR signals in a coordinated manner to generate high quality images of a selected slice(s) of the body (e.g., using the image data processor) and adjusts other parameters of the system 100. The stored information includes a predetermined pulse sequence of an imaging protocol and a magnetic field gradient and strength data as well as data indicating timing, orientation, and spatial volume of gradient magnetic fields to be applied in imaging.

The medical scanner 100 is configured by the imaging protocol to scan a region of a patient 11. For example, in MR, such protocols for scanning a patient for a given examination or appointment include diffusion-weighted imaging (acquisition of multiple b-values, averages, and/or diffusion directions), turbo-spin-echo imaging (acquisition of multiple averages), or contrast. In one embodiment, the protocol is for compressed sensing. The k-space is under sampled for more rapid scanning of the patient. The reconstruction may still reconstruct a representation in the object domain from the under sampled k-space data, but the representation may be more likely to suffer from noise. In another embodiment, parallel imaging is used. Multiple local coils are used to receive the data, providing additional information for reconstruction. In yet another embodiment, the protocol is for parallel imaging with compressed sensing.

The system 100 includes an operator interface 40, formed by an input and an output. The input may be an interface, such as interfacing with a computer network, memory, database, medical image storage, or other source of input data. The input may be a user input device, such as a mouse, trackpad, keyboard, roller ball, touch pad, touch screen, or another apparatus for receiving user input. The input may receive a scan protocol, imaging protocol, or scan parameters. An individual may select the input, such as manually or physically entering a value. Previously used values or parameters may be input from the interface. Default, institution, facility, or group set levels may be input, such as from memory to the interface.

The output is a display device but may be an interface. The images reconstructed from the scan are displayed. For example, an image of a region of the patient is displayed. A generated image of the reconstructed representation for a given patient is presented on a display of the operator interface 40.

The display is a CRT, LCD, plasma, projector, printer, or other display device. The display is configured by loading an image to a display plane or buffer. The display is configured to display the reconstructed MR image of the region of the patient. The computer 28 of the operator interface forms a graphical user interface (GUI) enabling user interaction with the central control unit 26 and enables user modification in substantially real time. The display processor 37 processes the magnetic resonance signals to provide image representative data for display on a display device, for example.

The central control unit 26 (i.e., controller) and/or processor 27 is an image processor that reconstructs a representation of the patient from the k-space data. The image processor is a general processor, digital signal processor, three-dimensional data processor, graphics processing unit, application specific integrated circuit, field programmable gate array, artificial intelligence processor, digital circuit, analog circuit, combinations thereof, or another now known or later developed device for reconstruction. The image processor is a single device, a plurality of devices, or a network. For more than one device, parallel or sequential division of processing may be used. Different devices making up the image processor may perform different functions, such as reconstructing by one device and volume rendering by another device. In one embodiment, the image processor is a control processor or other processor of the MR scanner 100. Other image processors of the MR scanner 100 or external to the MR scanner 100 may be used. The image processor is configured by software, firmware, and/or hardware to reconstruct. The instructions for implementing the processes, methods, and/or techniques discussed herein are provided on non-transitory computer-readable storage media or memories, such as a cache, buffer, RAM, removable media, hard drive, or other computer readable storage media. The instructions are executable by the processor or another processor. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the instructions set, storage media, processor or processing strategy and may be performed by software, hardware, integrated circuits, firmware, micro code, and the like, operating alone or in combination. In one embodiment, the instructions are stored on a removable media device for reading by local or remote systems. In other embodiments, the instructions are stored in a remote location for transfer through a computer network. In yet other embodiments, the instructions are stored within a given computer, CPU, GPU, or system. Because some of the constituent system components and method steps depicted in the accompanying figures may be implemented in software, the actual connections between the system components (or the process steps) may differ depending upon the manner in which the present embodiments are programmed.

The image processor is configured to reconstruct a representation of a scan region, such as a region of the patient. The image processor is configured to reconstruct a representation in an object domain. The representation or object in the object domain is reconstructed from the scan data in the scan domain. The scan data is a set or frame of k-space data from a scan of the patient. The object domain is an image space and corresponds to the spatial distribution of the patient. A planar or volume representation or object is reconstructed as an image representing the patient. For example, pixels values representing tissue in an area or voxel values representing tissue distributed in a volume are generated.

The reconstruction may be a traditional approach or optimization (e.g., not machine-learning based), such as generalized auto calibrating partially parallel acquisitions. In embodiments, the reconstruction is performed, at least in part, using a machine-learned model or algorithm such as the multichannel network. The machine-learned model is formed from one or more networks and/or other machine-learned arrangements (e.g., support vector machine). For an example used herein, the machine-learned model includes one or more deep-learned neural networks included in an unrolled iterative reconstruction algorithm. A machine-learned model is used for at least part of the reconstruction, such as regularization of reconstruction. In regularization, image or object domain data is input, and image or object domain data with less artifact is output. The remaining portions or stages of the reconstruction (e.g., Fourier transform and gradients in iterative optimization) are performed using reconstruction algorithms and/or other machine-learned networks. In other embodiments, a machine-learned model is used for all the reconstruction operations (one model to input k-space data and output regularized image data) or other reconstruction operations (e.g., used for transform, gradient operation, and/or regularization). The reconstruction is of an object or image domain from projections or measurements in another domain, and the machine-learned model is used for at least part of the reconstruction.

In an embodiment, the machine-learned model includes or is a multichannel network. The multichannel network may be referred to as a backbone network. The multichannel network includes multiple input channels, for example four or more input channels. A single multichannel network is configured and trained prior to implementation by the image processor, e.g., during the reconstruction process. In order to be able to use a single multichannel network, an adapter is used to convert or otherwise match the number of directions/repetitions in the scan data to the number of inputs of the single multichannel network. The adapter may use one or more of the following strategies including duplication of the single multichannel backbone network, dispatching or assigning the directions/repetitions to respective inputs, for example duplicating one or more of the directions/repetitions, or a model (for example an encoder decoder network) that converts certain number of inputs to a certain number of outputs.

Figure 2:
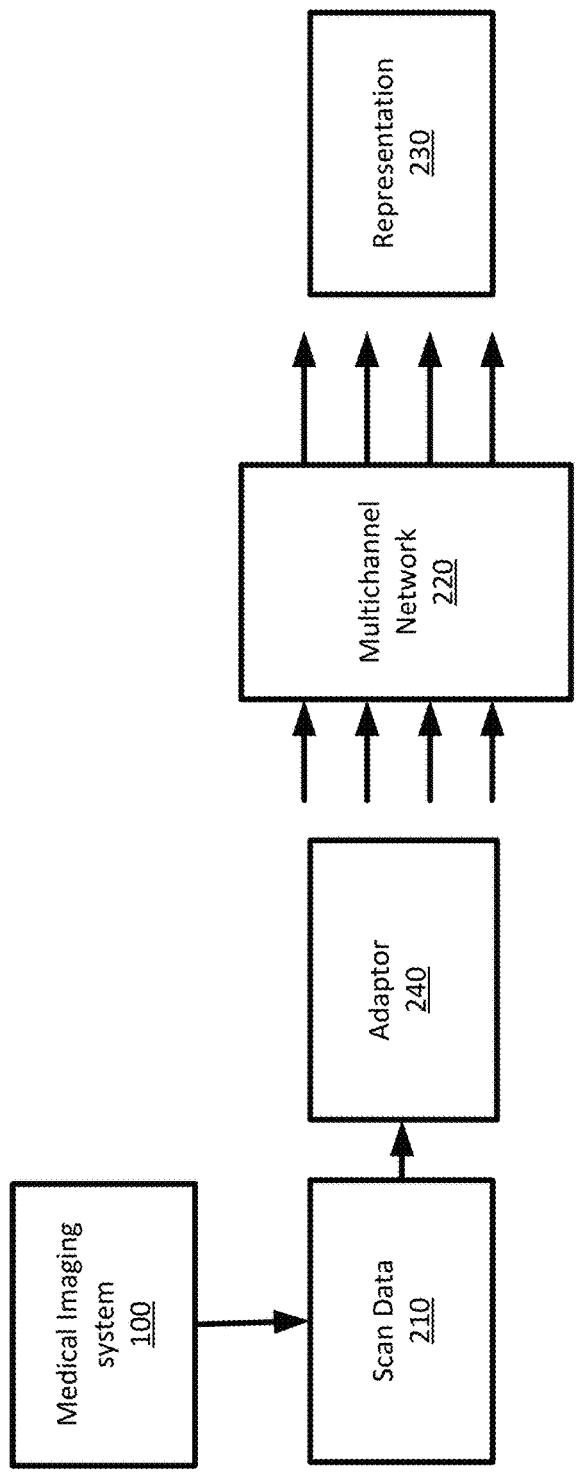
FIG. 2 depicts an example of a system for adapting scan data to a multichannel network according to an embodiment.

FIG. 2 depicts an example interface between the adapter 240, the medical imaging system 100, and a multichannel network 220. The medical imaging system 100 generates scan data 210 which is input into the adaptor 240 (or passes through). The adaptor 240 adapts the multiple repetitions to the input channels of the multichannel network 220. The multichannel network 220 may out the representation 230 or be part of a reconstruction network that generates the representation 230.

In the following examples, the multichannel network 220 includes four (4) input/output channels and there are six repetitions. During training, all of the data in the dataset is used independently of the number of repetitions and directions of each slide. If a slide being reconstructed has exactly 4 repetitions or directions, it can use the network as is, but if it has more repetitions or directions, one or multiple of the following options may be taken by the adapter. The adapter may duplicate the backbone network so that more channels are available. The adapter may use the encoder/decoder network to adapt the number of repetitions/directions to the number of available input/outputs. Finally, the adapter may use a dispatcher to assign (i.e., copy in that case) a repetition/direction to multiple channels of the backbone network. So, if for example the current data has 6 repetitions/directions, one solution would be to duplicate the backbone network, so that 8 channels are available, and then to dispatch 4 repetitions/directions to 4 channels of one of the backbone network copy, and the 2 remaining repetitions/directions to 4 channels of the other backbone network copy. In that case the 2 remaining repetitions/directions would be duplicated in order to match the 4 available channels of the second backbone network copy. Another solution would be to use a 6-to-4 encoder and 4-to-6 decoder so that the 6 repetitions/directions match the 4 channels of the backbone network.

Figure 3:
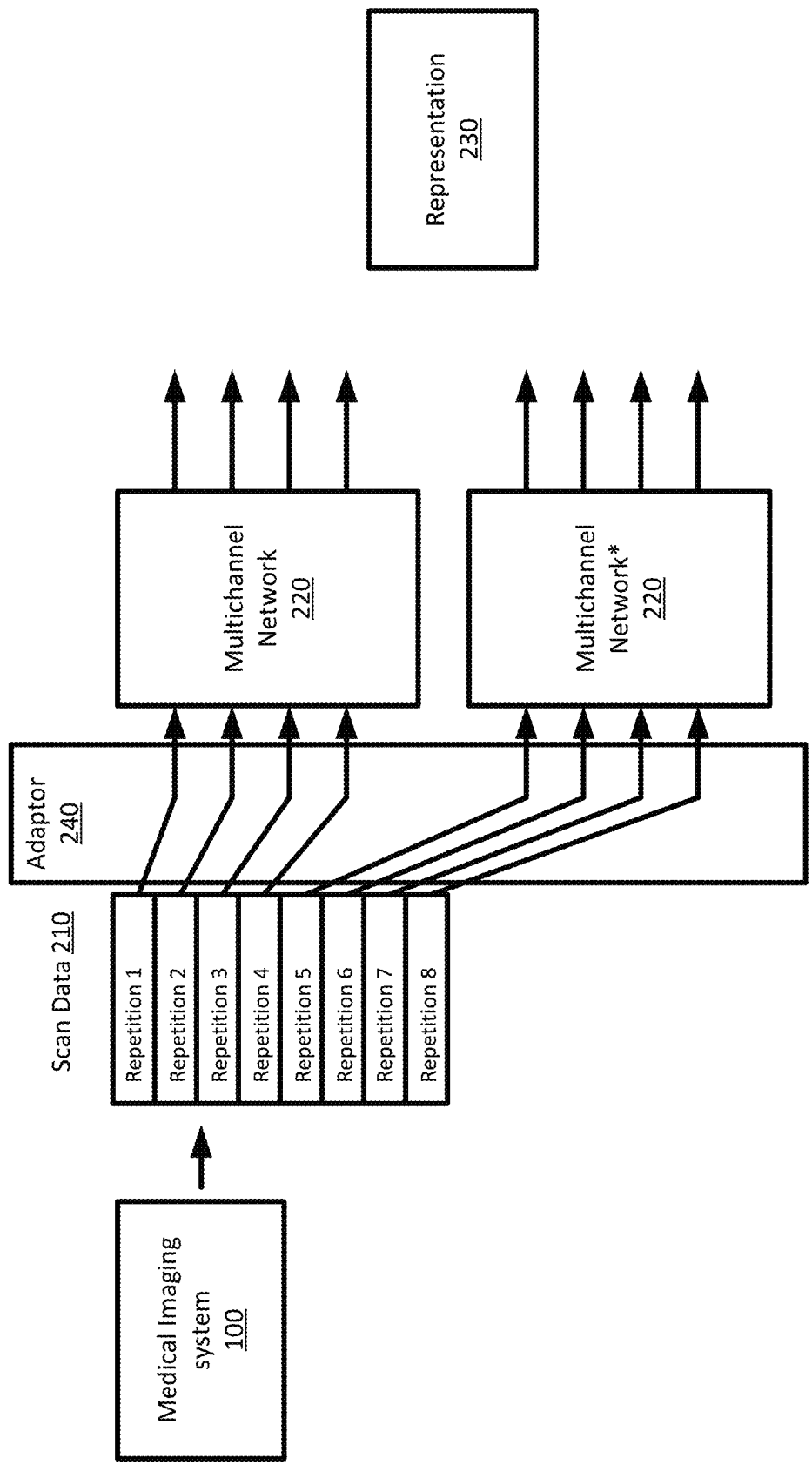
FIG. 3 depicts an example of duplicating a multichannel network by an adaptor according to an embodiment.
Figure 4:
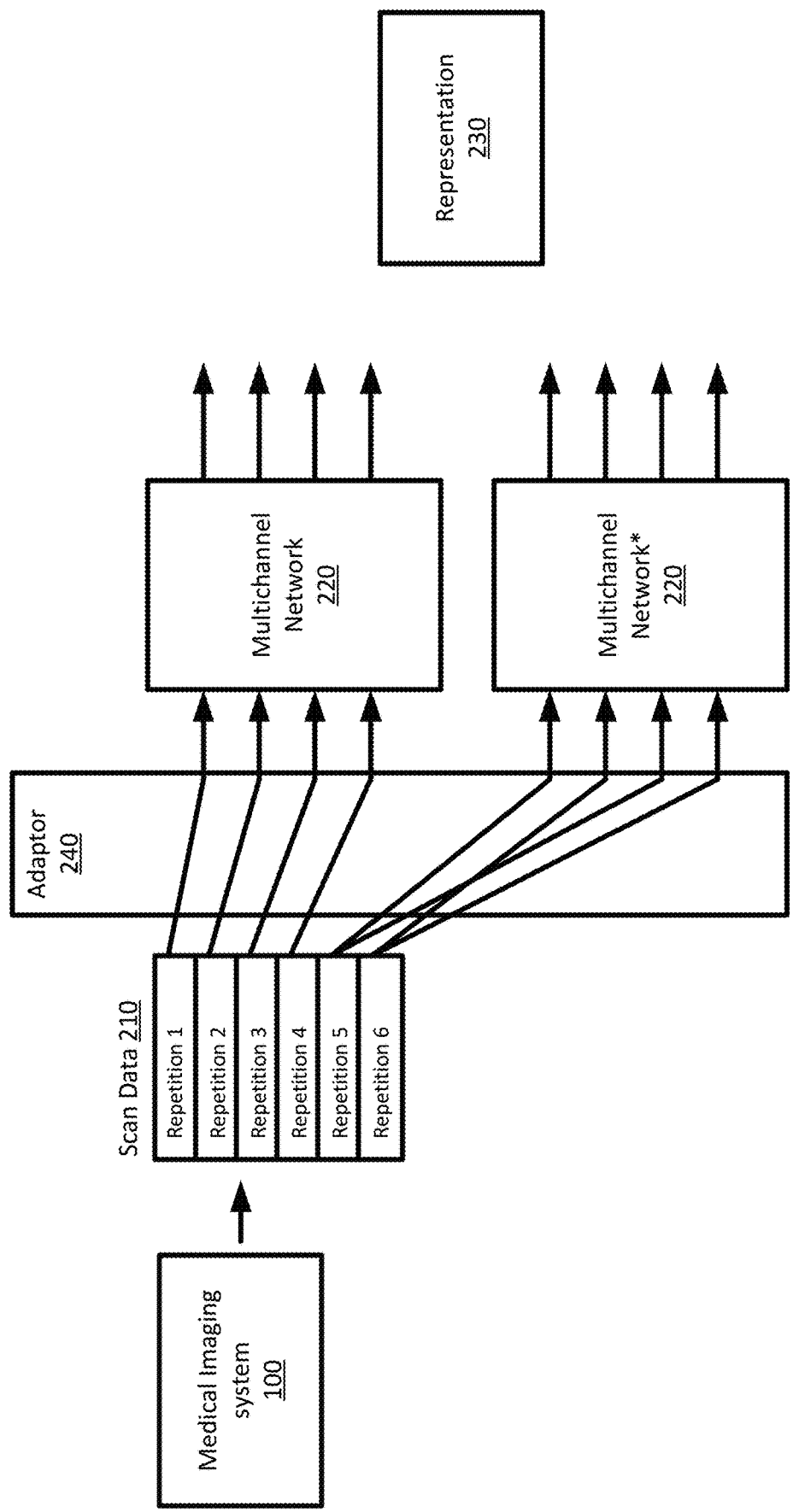
FIG. 4 depicts an example of duplicating a multichannel network by an adaptor according to an embodiment.

The adapter may duplicate the network, i.e., create a copy of the network so that multiple (forward and/or backward) paths can be done in parallel for different repetitions or directions. FIG. 3 depicts an example of a duplicated multichannel network 220 (denoted by an asterisk). In this example, the medical imaging system 100 generates scan data 210 that has eight different repetitions. The adaptor 240 duplicates the multichannel network 220 (which has four input and output channels) so that all eight repetitions may be processed by the multichannel network(s). The adaptor 240 may assign each input data (i.e., a given repetition/direction) to its network copy and channel. FIG. 4 depicts an example of a duplicated multichannel network 220 and assigned repetitions. In FIG. 4 there are six repetitions. In this scenario, the adaptor 240 duplicates the multichannel network 220 (indicated by an asterisk). The adapter 240 then assigns the first four repetitions to the first multichannel network 220 and then assigns repetition 5 and 6 to the duplicated multichannel network 220. The adapter 240 duplicated repetition 5 and 6 so that the duplicated multichannel network 220 has four inputs for its four input channels.

Figure 5:
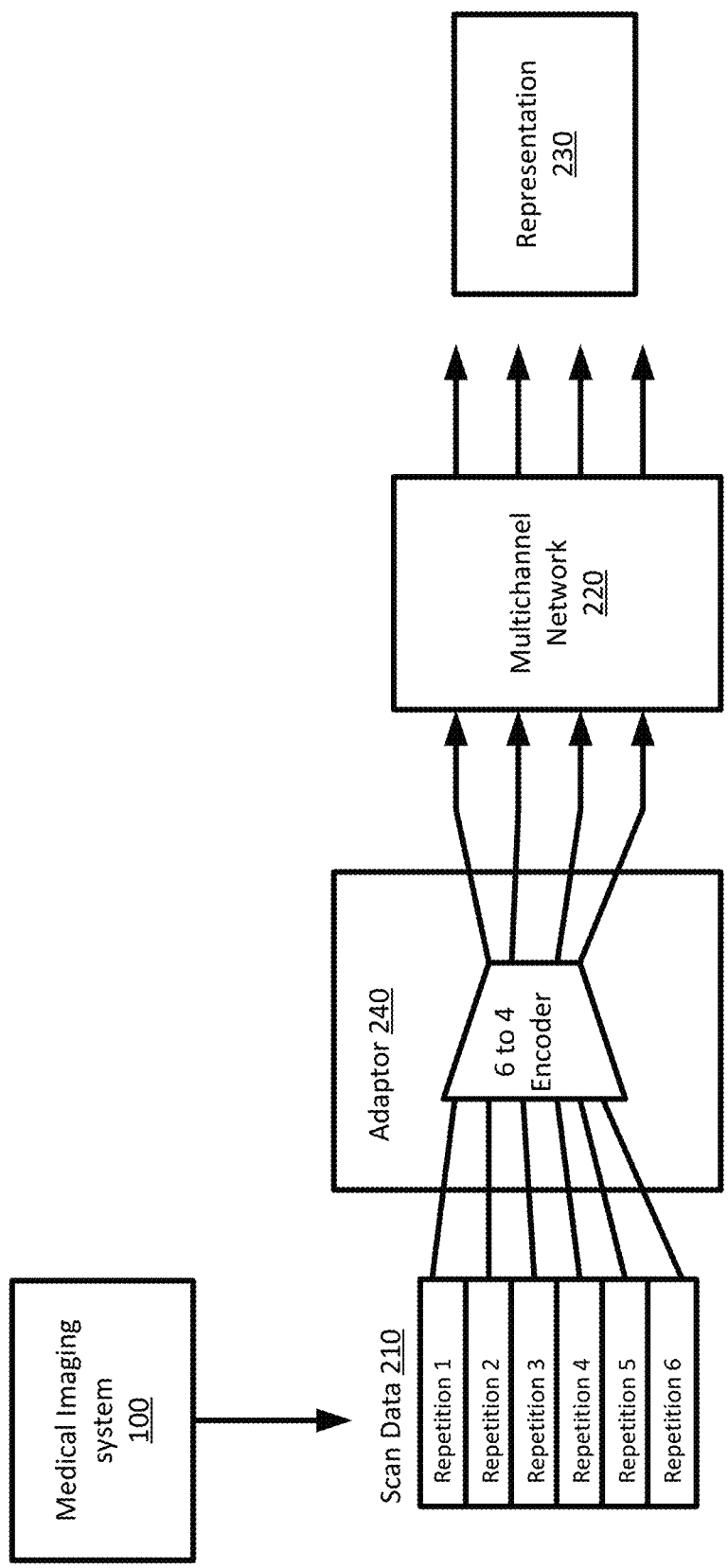
FIG. 5 depicts an example of applying an encoder by an adaptor according to an embodiment.

The adapter may also use an encoder/decoder network adaptor that is specialized in converting a certain number of inputs to a certain number of outputs. FIG. 5 depicts a 6 to 4 encoder implemented by the adaptor 240. The encoder transforms a certain number of repetitions/directions into a certain number of latent inputs, while a decoder (not depicted) transforms a certain number of latent inputs to a certain number of repetitions/directions outputs. The idea of the encoder/decoders is to specialize a part of the network to the specific of the data in terms of number of repetitions/directions, so that the central part of the network, called backbone network, is compatible and can be used by all the data.

The adapter is further used during training or configuration of the network prior to implementation. The adapter allows the multichannel network 220 to use all or almost all of the data included in a training dataset. For example, a training dataset may contain 1000 instances of scan data 210. 500 instances include exactly four repetitions or directions. 200 include exactly six repetitions or directions. 150 include seven or more repetitions/directions. 150 include three or less repetitions. Without the adapter, a multichannel network 220 with exactly four input channels might only be able to use 50% of the scan data 210 in the dataset. A multichannel network 220 with, for example, six input channels fairs even worse and is only able to use 15% of the dataset. The long tail (more than six) potentially has a sparse dataset that can be used to train a specific multichannel network 220. With such few scan data 210, the resulting multichannel networks may operate at a lower efficiency or quality. Using the adapter 240, however, a single multichannel network 220 may use all of the examples and thus be better or more completely trained.

Machine learning is an offline training phase where the goal is to identify an optimal set of values of learnable parameters of the multichannel network 220 that can be applied to different inputs. These machine-learned parameters can subsequently be used during clinical operation. Once learned, the machine-learned multichannel network 220 is used in an online processing phase in which a reconstruction for a given patient.

A computer (e.g., the image processor) machine trains the multichannel network 220. For example, the multichannel network 220 is machine trained using training data. The training data includes many sets of data, such as representations output by reconstruction and the corresponding ground truth including multiple different numbers of repetitions/directions. The adapter is applied during training so that the backbone network may make use of the entire dataset even if the number of inputs to the backbone network do not match the output number of repetitions/directions of the training scan data 210. Tens, hundreds, or thousands of samples are acquired, such as from scans of volunteers or patients, scans of phantoms, simulation of scanning, and/or by image processing to create further samples. Many examples that may result from different scan settings, patient anatomy, scanner characteristics, or other variance that results in different samples are used. In one embodiment, an already gathered or created MR dataset is used for the training data. The samples are used in machine learning (e.g., deep learning) to determine the values of the learnable variables (e.g., values for convolution kernels) that produce outputs with minimized cost or loss across the variance of the different samples.

In one embodiment, deep learning is used for training. The training learns both the features of the input data and the conversion of those features to the desired output. Backpropagation, RMSprop, ADAM, or another optimization is used in learning the values of the learnable parameters of the network (e.g., the convolutional neural network (CNN) or fully connection network (FCN)). Where the training is supervised, the differences (e.g., L1, L2, mean square error, or other loss) between the estimated output and the ground truth output are minimized.

Any architecture or layer structure for machine learning may be used for the multichannel network 220. For example, any of the architectures may be used. The architecture defines the structure, learnable parameters, and relationships between parameters. In one embodiment, a convolutional or another neural network is used. Any number of layers and nodes within layers may be used. A DenseNet, U-Net, encoder-decoder, Deep Iterative Down-Up CNN, image-to-image and/or another network may be used. Some of the network may include dense blocks (i.e., multiple layers in sequence outputting to the next layer as well as the final layer in the dense block). Any know known or later developed neural network may be used. Any number of hidden layers may be provided between the input layer and output layer.

If an unrolled network with data-consistency and regularization blocks is used for the reconstruction, the mechanisms discussed herein are applicable to the regularization blocks of the unrolled network. The data-consistency steps of the unrolled network may be used in parallel with all the repetitions/directions.

Figure 6:
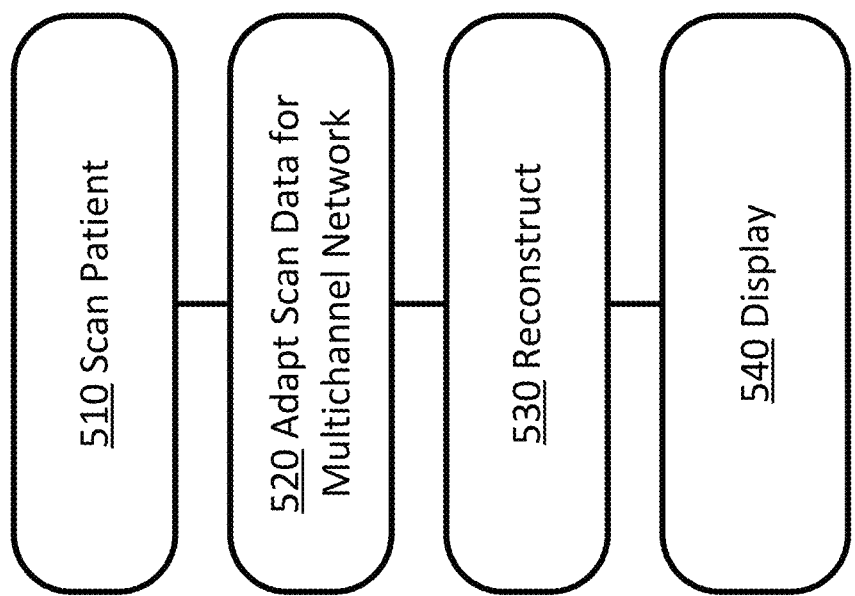
FIG. 6 depicts a method for reconstruction of a medical image according to an embodiment.

FIG. 6 is a flow chart diagram of one embodiment of a method for reconstruction of a medical image in a medical imaging system 100, such as reconstruction of a MR image in an MR system. The method is performed by the system of FIG. 1 or another system. The medical scanner scans the patient and outputs scan data 210 including two or more repetitions or directions. An adapter 240 adapts the repetitions/directions so that each repetition is used at least once in a multichannel network 220 that has a fixed number of inputs different than the number of repetitions/directions. The multichannel network 220 is configured to reconstruct a representation 230. The representation 230 may be a medical image, A display displays the medical image. Other components may be used, such as a remote server or a workstation performing the acquisition of the scan data 210, the reconstruction, and/or the display.

The method is performed in the order shown or other orders. Additional, different, or fewer acts may be provided. For example, a preset, default, or user input setting are used to configure the scanning in act 510. As another example, the image is stored in a memory (e.g., computerized patient medical record) or transmitted over a computer network instead of or in addition to the display of act 540.

In act 510, the medical imaging system scans a patient. The scan is guided by a protocol, such as parallel imaging with compressed sensing or another protocol. The pulse or scan sequence scans the region of the patient, resulting in scan data 210 for a single imaging appointment. In an MR example, a pulse sequence is created based on the configuration of the MR scanner (e.g., the imaging protocol selected). The pulse sequence is transmitted from coils into the patient. The resulting responses are measured by receiving radio frequency signals at the same or different coils. The scanning results in k-space measurements as the scan data 210.

The protocol may include acquiring multiple repetitions or directions. An example of a protocol that includes multiple repetitions or directions is Diffusion weighted imaging (DWI). DWI characterizes the water motion in the human body. Normal water motion in the brain is predominantly random or Brownian, with no direction predilection. However, myelin sheaths' orientation can create a preferential movement of water molecules parallel to the fibers and hence an "anisotropic diffusion." Diffusion imaging involves a slight modification of T2-weighted sequences. Two diffusion sensitizing gradients of equal strength (termed the b value) are applied in opposing directions before and after a 180° refocusing pulse. The first gradient pulse causes a phase shift, and the second pulse will "rephase" the initial phase shift. The fundamental idea behind diffusion-weighted imaging is the attenuation of T2* signal based on how easily water molecules are able to diffuse in that region. The more easily water can diffuse (i.e., the further a water molecule can move around during the sequence) the less initial T2* signal will remain. For example, water within cerebrospinal fluid (CSF) can diffuse very easily, so very little signal remains, and the ventricles appear black. In contrast, water within brain parenchyma cannot move as easily due to cell membranes getting in the way and therefore the initial T2* signal of the brain is only somewhat attenuated. An important consequence of this is that if a region of the brain has zero T2* signal it cannot, regardless of the diffusion characteristics of that tissue, show signal on isotropic diffusion-weighted images. The way in which diffusion information is extracted from the tissue is to first obtain a T2* weighted image with no diffusion attenuation. This is known as the b=0 image. The ease with which water can diffuse is assessed in various directions; the minimum is 3 orthogonal directions (X, Y and Z). This process generates four sets of images: a T2* b=0 image and three diffusion-weighted images (one for each X, Y and Z direction) with the T2* signal attenuated according to how easily water can diffuse in that direction.

In another example, In-vivo DT-CMR requires the rapid acquisition of multiple single-shot diffusion weighted images with diffusion encoded in at least six different 3D directions. Multiple repetitions are commonly acquired to increase the quality of the signal.

In act 520, the image processor adapts the multiple repetitions or directions into a second number of inputs based on a fixed number of input channels for a multichannel network 220. The image processor/adapter 240 may alter the scan data 210 or the multichannel network 220. The image processor may implement one or more options to adapt the repetitions or direction to the number of input channels of the multichannel network 220. These options include duplicating the multichannel network 220 to increase the number of input channels, assigning the repetitions to input channels (for example by duplicated one or more of the repetitions), or using a model or network that converts the quantity of repetitions to a useable quantity of inputs for the input channels of the multichannel network 220.

For duplication, the image processor may duplicate the network, i.e., create a copy of the network so that multiple (forward and/or backward) paths can be done in parallel for different repetitions or directions. The image processor may assign each input data (i.e., a given repetition/direction) to its network copy and channel. Finally, the image processor may use an encoder/decoder network. The encoder/decoder may be a neural network module that is specialized in converting a certain number of inputs to a certain number of outputs. The encoder transforms a certain number of repetitions/directions into a certain number of latent inputs, while the decoder transforms a certain number of latent inputs to a certain number of repetitions/directions outputs. The encoder/decoders specialize a part of the network to the specific of the data in terms of number of repetitions/directions, so that the central part of the network, e.g., the multichannel network 220, is compatible and can be used by all the data.

In an example, the multichannel network 220 has four input channels. If the scan data 210 has four repetitions (or pieces of data) then the adapter may assign each of the scan data 210 to a respective input channel. If for example, each of the repetitions also have two different directions (and thus eight different outputs) then the adapter may duplicate the multichannel network 220—thus providing room for eight inputs. The output of the duplicated networks may be averaged or otherwise aggregated during the reconstruction process. In another example, the scan data 210 may include 10 different outputs (repetitions/directions). The adapter 250 may duplicate the multichannel network 220 to provide eight input channels. The adapter 240 may then use a 6 to 4 or 4 to 2 encoder decoder network to transform the ten outputs to the eight input channels.

In act 530, an image processor reconstructs using the multichannel network 220, an image for the scan data 210. The object (e.g., anatomy) of the patient that was scanned is reconstructed. The image processor reconstructs a representation 230 or reconstruction from the scan data 210 of the scan. For MR reconstruction, the k-space data is Fourier transformed into scalar values representing different spatial locations, such as spatial locations representing a plane through or volume of a region in the patient. Scalar pixel or voxel values are reconstructed as the MR image or object. The spatial distribution of measurements in object or image space is formed. This spatial distribution represents the object of the patient.

Various inputs for reconstruction may be used. In an embodiment, the reconstruction uses an iterative process. The scan data 210 is input, such as inputting under-sampled multi-coil k-space data. Coil sensitivity maps and/or an input coil bias field correction map may be input. The reconstruction is performed using any of various techniques. For example, an optimization is performed to fit the scan data 210 to an estimated representation 230, such as GRAPPA or other reconstruction algorithm. In embodiments, the reconstruction uses, at least in part, the multichannel network 220 trained with deep machine learning. The multichannel network 220 is previously trained, and then used as trained in reconstruction. Fixed values of learned parameters are used for application.

In embodiments, the multichannel network 220 is trained to receive input of the scan data 210 and to output the reconstruction. In other embodiments, the multichannel network 220 is used in the reconstruction process, such as for applying a Fourier or inverse Fourier transform, determining a gradient, and/or regularization. Optimization is iteratively performed with the multichannel network 220 contributing to an act or acts (i.e., stages) in each or some of the iterations.

In act 540 of FIG. 6, the image processor displays the image of the object from the output of the multichannel network 220. The image has a level of level of noise relative to sharpness based on the user-selected level (e.g., of denoising). The resulting representation 230 or image is then rendered to a two-dimensional display. A display (e.g., display screen or device) displays the medical image, such as the MR image. The medical image, after or as part of any post processing, is formatted for display on the display. The display presents the image for viewing by the user, radiologist, physician, clinician, and/or patient. The image assists in diagnosis, prognosis, and/or therapy.

Figure 7:
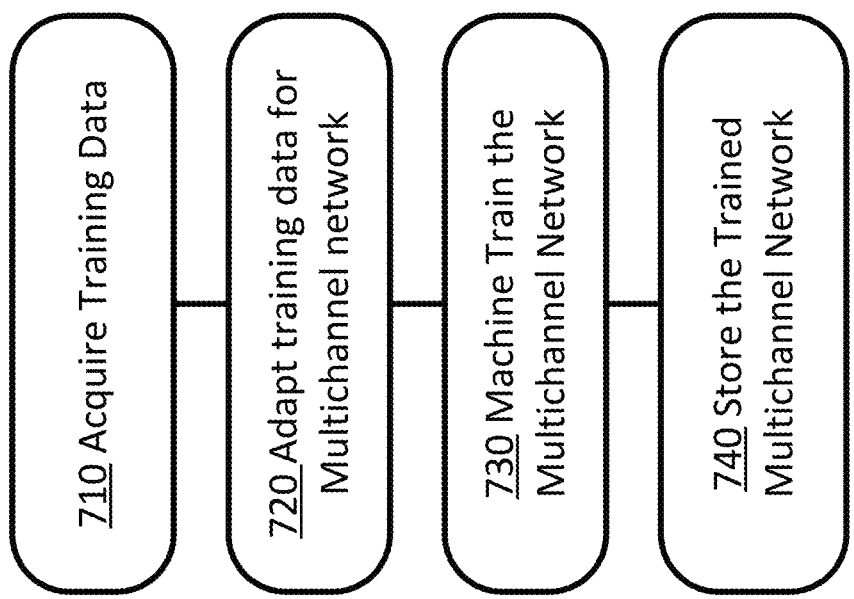
FIG. 7 depicts a method for training a multichannel network according to an embodiment.

FIG. 7 is a flow chart diagram of one embodiment of a method for training a multichannel network 220 configured for reconstruction of a MR image in an MR system. The method is performed by the system of FIG. 1 or another system.

At act 710, acquiring a training set of scan data 210 comprising multiple different numbers of repetitions or directions. The training data includes ground truth data or gold standard data, for example verified MR scan data 210 and reconstructed images that have been verified, for example, by operators. Ground truth data and gold standard data is data that includes correct or reasonably accurate labels that are verified manually or by some other accurate method. The training data includes scan data 210 with different numbers of repetitions/directions. For example, certain data may include four repetitions, while other scan data 210 in the training data set may include six repetitions or more. The use of the adaptor 240 below at act 720, allows the multichannel network 220 to be trained using all or almost all of the training data even if the number of repetitions/directions does not exactly match the number of input channels for the multichannel network 220.

At act 720, adapting each of the training data so that the different numbers of repetitions match a fixed number of input channels of a multichannel network 220. An adaptor 240 identifies the number of outputs (directions/repetitions) for each instance of scan data 210. The adaptor 240 adapts this number so that the data may be reasonably input into the multichannel network 220.

At act 730, machine training the multichannel network 220 for MR reconstruction using the training data. In an example operation the multichannel network 220 inputs the training data (as adapted by the adaptor 240) and outputs an image. The image is compared to the training data. A loss function may be used to identify the errors from the comparison. The loss function serves as a measurement of how far the current set of predictions are from the corresponding true values. Some examples of loss functions that may be used include Mean-Squared-Error, Root-Mean-Squared-Error, and Cross-entropy loss. Mean Squared Error loss, or MSE for short, is calculated as the average of the squared differences between the predicted and actual values. Root-Mean Squared Error is similarly calculated as the average of the root squared differences between the predicted and actual values. During training and over repeated iterations, the multichannel network 220 attempts to minimize the loss function as the result of a lower error between the actual and the predicted values means the network has done a good job in learning. Different optimization algorithms may be used to minimize the loss function, such as, for example, gradient descent, Stochastic gradient descent, Batch gradient descent, Mini-Batch gradient descent, among others. The process of inputting, outputting, comparing, and adjusting is repeated for a predetermined number of iterations with the goal of minimizing the loss function.

At act 740, the multichannel network 220 is stored for use. The parameters that were optimized or configured during training are saved. One trained, the multichannel network 220 may be used during a medical imaging procedure. The medical scanner scans the patient and outputs scan data 210. The adapter adapts, converts, or assigns the different directions or repetitions of the scan data 210 to the fixed number of inputs of the trained multichannel network 220. The trained multichannel network 220 reconstructs a representation 230. The representation 230 may be a medical image, A display displays the medical image. Other components may be used, such as a remote server or a workstation performing the acquisition of the scan data 210, the reconstruction, and/or the display.

The displayed image may represent a planar region or area in the patient. Alternatively, or additionally, the displayed image is a volume or surface rendering from voxels (three-dimensional distribution) to the two-dimensional display.

Embodiments of the method of FIG. 7 allow for robust training of a multichannel network 220. The ability to use all or most of the scan data 210 in the training data set provides for a better or improved training process.

Although the subject matter has been described in terms of exemplary embodiments, it is not limited thereto. Rather, the appended claims should be construed broadly, to include other variants and embodiments, which can be made by those skilled in the art.

The invention claimed is:

1. A system for using a multichannel network for image reconstruction, the system comprising:

a medical scanner configured to scan a region of a patient, the scan providing scan data including multiple respective repetitions or directions;

a multichannel network comprising a fixed number of input channels, the multichannel network configured to reconstruct a representation of the scan data;

an adapter configured to duplicate the multichannel network such that each of the multiple respective repetitions or directions is used at least once as an input to the multichannel network or the duplicated multichannel network compressing or decompressing with parallel imaging, using an encoder decoder network, the multiple respective repetitions such that each input channel of a fixed number of input channels for the multichannel network includes an input from the scan data;

and a display configured to display the representation of the scan data.

2. The system of claim 1, wherein the adapter is further configured to assign each of the respective repetitions or directions to respective input channels of the fixed number of input channels of the multichannel network such that each of the fixed number of input channels inputs one of the respective repetitions or directions.

3. The system of claim 1, wherein the adapter is further configured to compress or decompress, using an encoder decoder network, the multiple respective repetitions or directions such that each of the fixed number of input channels includes an input from the scan data.

4. The system of claim 1, wherein an unrolled network with data-consistency and regularization blocks is used for reconstruction, wherein the multichannel network comprises the regularization blocks of the unrolled network.

5. The system of claim 1, wherein scanning comprises magnetic resonance scanning pursuant to a protocol for diffusion weighted imaging (DWI).

6. The system of claim 1, wherein the multichannel network is trained using a dataset with scan data with different numbers of repetitions or directions.

7. The system of claim 1, wherein the multichannel network includes at least four input channels.

8. A method of reconstruction for a medical imaging system, the method comprising:

scanning a patient by the medical imaging system, the scanning acquiring scan data comprising multiple repetitions;

compressing or decompressing with parallel imaging, using an encoder decoder network, the multiple respective repetitions such that each input channel of a fixed number of input channels for the multichannel network includes an input from the scan data;

reconstructing, by the multichannel network, an image for the scan data;

and displaying the image.

9. The method of claim 8, further comprising:

duplicating the multichannel network such that each of the multiple respective repetitions is used at least once as an input to the multichannel network or the duplicated multichannel network.

10. The method of claim 8, further comprising:

assigning each of the multiple respective repetitions to respective input channels of the fixed number of input channels of the multichannel network such that each of the fixed number of input channels inputs one of the respective repetitions.

11. The method of claim 8, wherein an unrolled network with data-consistency and regularization blocks is used for reconstruction, wherein the multichannel network comprises the regularization blocks of the unrolled network.

12. The method of claim 8, wherein scanning comprises magnetic resonance scanning pursuant to a protocol for diffusion weighted imaging (DWI).

13. The method of claim 8, wherein the multichannel network is trained using a dataset with scan data with different numbers of repetitions.

14. The method of claim 8, wherein the multichannel network includes at least four input channels.

15. The method of claim 8, wherein the multiple repetitions comprise different directions.

16. A method for training a multichannel network, the method comprising:
- acquiring a training set of scan data comprising multiple different numbers of repetitions;
  - adapting each of the training data so that the different numbers of repetitions match a fixed number of input channels of a multichannel network, wherein adapting comprises:
    - duplicating the multichannel network such that each of the multiple respective repetitions is used at least once as an input to the multichannel network or the duplicated multichannel network, assigning each of the multiple respective repetitions to respective input channels of the fixed number of input channels of the multichannel network such that each of the fixed number of input channels inputs one of the respective repetitions,
  - and compressing or decompressing with parallel imaging, using an encoder decoder network, the multiple respective repetitions such that each input channel of a fixed number of input channels for the multichannel network includes an input from the scan data;
- machine training the multichannel network for MR reconstruction using the training data; and
- storing the multichannel network.

17. The method of claim 16, wherein the multichannel network includes at least four input channels.

\* \* \* \* \*